(12) United States Patent
Bunea et al.

(10) Patent No.: US 11,418,145 B2
(45) Date of Patent: Aug. 16, 2022

(54) PHOTOVOLTAIC MODULE HAVING AN EXTERNAL ELECTRICAL CONNECTOR (71) Applicant: SunPower Corporation, San Jose, CA (US)

(72) Inventors: Gabriela Elena Bunea, San Jose, CA (US); Cuong Manh Ta, San Jose, CA (US); Lewis Abra, San Francisco, CA (US); Lee Gorny, Mountain View, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 16/821,873

(22) Filed: Mar. 17, 2020

(65) Prior Publication Data
US 2020/0220495 A1 Jul. 9, 2020

Related U.S. Application Data (63) Continuation of application No. 15/201,064, filed on Jul. 1, 2016, now abandoned.

(51) Int. Cl.
H02S 40/34 (2014.01)
H01L 31/042 (2014.01)
(Continued)

(52) U.S. Cl.
CPC ........ *H02S 40/34* (2014.12); *H01L 31/02013* (2013.01); *H01L 31/042* (2013.01);
(Continued)

(58) Field of Classification Search
CPC .......... H02S 40/30; H02S 40/32; H02S 40/34; H02S 40/345; H02S 40/36; H02S 40/346; H01L 31/05–0516
See application file for complete search history.

(56) References Cited

U.S. PATENT DOCUMENTS 4,283,106 A 8/1981 Bunnell
4,310,211 A 1/1982 Bunnell et al.
(Continued)

FOREIGN PATENT DOCUMENTS

CN 101919066 A 12/2010
CN 101919066 A 12/2010
(Continued)

OTHER PUBLICATIONS

Third Office Action from Chinese Patent Application No. 2017800379734 dated Jan. 6, 2021, 11 pages (including Google translation).
(Continued)

Primary Examiner — Eric R Smith
(74) Attorney, Agent, or Firm — Grasso PLLC (57) ABSTRACT A photovoltaic module having an external electrical connector is described. For example, the photovoltaic module may include a plug receptacle mounted on a module laminate, and a contact may extend from a photovoltaic cell within the module laminate into a plug channel of the plug receptacle. The plug receptacle may receive a mating electrical connector, e.g., an electrical plug, of off-panel electronics. Accordingly, the contact may be removably connected to the mating electrical connector, and the photovoltaic cell may be placed in electrical connection with the off-panel electronics.

20 Claims, 9 Drawing Sheets (51) Int. Cl.
  *H01L 31/05* (2014.01)
  *H01L 31/02* (2006.01)
  *H01L 31/0443* (2014.01)
  *H01L 31/048* (2014.01)
  *H01L 31/18* (2006.01)
  *H01R 13/04* (2006.01)
  *H01R 24/76* (2011.01)
  *H01R 43/20* (2006.01)
  *H01R 101/00* (2006.01)

(52) U.S. Cl.
  CPC ...... *H01L 31/0443* (2014.12); *H01L 31/0488* (2013.01); *H01L 31/0504* (2013.01); *H01L 31/1876* (2013.01); *H01R 13/04* (2013.01); *H01R 24/76* (2013.01); *H01R 43/20* (2013.01); *H01R 2101/00* (2013.01)

(56) References Cited

U.S. PATENT DOCUMENTS

| | | | |
|---|---|---|---|
| 6,337,436 | B1 | 1/2002 | Ganz |
| 6,469,242 | B1 | 10/2002 | Kondo |
| 9,184,327 | B2 | 11/2015 | Rose et al. |
| 9,954,484 | B2 | 4/2018 | Park et al. |
| 9,972,726 | B2 | 5/2018 | Park et al. |
| 2008/0156365 | A1 | 7/2008 | Scholz et al. |
| 2008/0194154 | A1 | 8/2008 | Minnick |
| 2010/0233909 | A1 | 9/2010 | Scherer et al. |
| 2010/0275976 | A1 | 11/2010 | Rubin et al. |
| 2011/0041896 | A1* | 2/2011 | Jautard ................ H01R 13/665 136/251 |
| 2011/0132427 | A1 | 6/2011 | Kalkanoglu et al. |
| 2012/0152349 | A1* | 6/2012 | Cao ........................ H02S 40/34 438/66 |
| 2013/0153003 | A1 | 6/2013 | Berens et al. |
| 2014/0318602 | A1 | 10/2014 | Black |
| 2015/0144181 | A1 | 5/2015 | Gilchrist et al. |
| 2016/0173026 | A1 | 6/2016 | Goei et al. |

FOREIGN PATENT DOCUMENTS

| | | |
|---|---|---|
| DE | 102010016636 | 10/2011 |
| EP | 0033031 | 8/1981 |
| JP | 2001-015789 A | 1/2001 |
| JP | 2016/029661 | 3/2016 |
| WO | 2009-076740 A1 | 6/2009 |
| WO | 2009076740 A1 | 6/2009 |
| WO | WO 2015/017149 | 2/2015 |

OTHER PUBLICATIONS

Notice of Reasons for Rejections from Japanese Patent Application No. 2018-559921 dated Apr. 30, 2021, 2 pages (including computer translation).
Decision of Rejection from Chinese Patent Application No. 2017800379734 dated Jun. 11, 2021, 11 pages.
Google Translation of Decision of Rejection from Chinese Patent Application No. 2017800379734 dated Jun. 11, 2021, 44 pages.
International Search Report and Written Opinion from PCT/US2017/039802 dated Sep. 20, 2017, 12 pgs.
International Preliminary Report on Patentability from PCT/US2017/039802 dated Jan. 19, 2019, 10 pgs.
Extended European Search Report for European Application No. EP 17821171.0 dated May 27, 2019, 6 pgs.
First Office Action from Chinese Patent Application No. 2017800379734 dated Dec. 2, 2019, 16 pgs.
Second Office Action from Chinese Patent Application No. 2017800379734 dated Aug. 10, 2020, 13 pgs.
Japanese Patent Office Decision of Refusal dated Jan. 21, 2022, JPO Application No. 2018-559921.
Japanese Patent Office Decision of Refusal Dated Jan. 21, 2022, JPO Application No. 2018-559921 (Third-party Translation).
Office Action Korean Intellectual Property Office, Application No. 10-209-7000769 dated May 31, 2022.

* cited by examiner

PHOTOVOLTAIC MODULE HAVING AN EXTERNAL ELECTRICAL CONNECTOR

CROSS-REFERENCE TO RELATED APPLICATIONS

This application is a continuation of U.S. patent application Ser. No. 15/201,064, filed on Jul. 1, 2016, the entire contents of which are hereby incorporated by reference herein.

BACKGROUND

Photovoltaic (PV) cells, commonly known as solar cells, are well known devices for converting solar radiation into electrical energy. Generally, solar cells are fabricated on a semiconductor wafer or substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are coupled to metal contacts on the solar cell to direct an electrical current from the cell to an external circuit coupled thereto. Generally, an array of solar cells, each solar cell interconnected, is mounted on a common or shared platform to provide a photovoltaic module. A photovoltaic module may be composed of a photovoltaic laminate. A plurality of photovoltaic modules or module groups may be electrically coupled to an electrical power distribution network, forming a photovoltaic system.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" direction does not necessarily imply that this direction is the first direction in a sequence; instead the term "first" is used to differentiate this direction from another direction (e.g., a "second" direction).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper," "lower," "above," "below," "in front of," and "behind" refer to directions in the drawings to which reference is made. Terms such as "front," "back," "rear," "side," "outboard," "inboard," "leftward," and "rightward" describe the orientation and/or location of portions of a component, or describe the relative orientation and/or location between components, within a consistent but arbitrary frame of reference which is made clear by reference to the text and the associated drawings describing the component(s) under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

PV cells can be assembled into a PV string inside of a PV module, which may be used to convert sunlight into electricity. Electricity is typically carried from the module circuit, i.e., from the PV string, to on-panel electronics of a PV system. More particularly, the on-panel electronics typically include electronic components, such as a diode, a microinverter, or a DC optimizer, housed within a junction box or a PV dock attached to a backsheet of the PV module. The junction box or PV dock is ordinarily fixed to the backsheet by a silicone-based adhesive after the PV module is fully formed by a lamination process. Electrical ribbons, i.e., thin and pliable metallic strips, are attached to the module circuit inside of the PV module during the lamination process, and then routed through manually cut slits in the backsheet to carry electrical current outward into the attached junction box.

As described above, existing photovoltaic (PV) modules include thin and pliable electrical ribbons extending from in-panel module circuitry through a backsheet of a PV module to on-panel electronics. The direct connection between the in-panel module circuitry and the on-panel electronics may be convenient in that different junction boxes may be fixed to the PV module to provide different functionality, but the on-panel electronics lacks component interchangeability. That is, once the on-panel electronics are attached, they cannot be removed or replaced. Furthermore, routing the electrical ribbons from the in-panel module circuitry to the on-panel electronics requires manual finesse and is not easily automated, which translates to increased manufacturing time and costs. Accordingly, providing a PV module having an external electrical connector can allow the PV module to be easily and interchangeably connected to off-panel electronics, and thus, the PV module can improve PV system flexibility and manufacturing efficiency.

In an aspect, a PV module having an external electrical connector is provided. More particularly, the external electrical connector may include a contact, e.g., a metal blade-type connector, that is permanently bonded to an electrical conductor, e.g., a bus bar or an electrical ribbon, within a PV module laminate, and extends outward through a plug receptacle mounted on the PV module laminate. The plug receptacle can provide electrical and environmental protection for the contact, can receive a mating electrical connector, e.g., a plug, and can mechanically support the contact when the mating electrical connector is engaged with the external electrical connector. Thus, the in-panel module circuitry may be electrically connected through the contact to the mating electrical connector, and to an external cable or off-panel electronics connected to the mating electrical connector.

The aspects described above may be realized by the PV module having an external electrical connector as disclosed herein. In the following description, numerous specific details are set forth, such as specific material regimes and component structures, in order to provide a thorough understanding of embodiments of the present disclosure. It will be apparent to one skilled in the art that embodiments of the present disclosure may be practiced without these specific details. In other instances, well-known fabrication techniques or component structures, such as specific types of electrical connectors or module lamination processes, are not described in detail in order to not unnecessarily obscure embodiments of the present disclosure. Furthermore, it is to be understood that the various embodiments shown in the figures are illustrative representations and are not necessarily drawn to scale.

By way of summary, disclosed herein is a PV system and module having an external electrical connector. In an embodiment, the PV system includes a PV module electrically connected to an off-panel electronics device by an external cable. The PV module may include a module laminate having an electrical conductor electrically connected to a PV cell. A contact may be attached to the electrical conductor, and may extend outward into a plug channel of a plug receptacle mounted on the module laminate. Thus, the contact may convey electrical current from the PV cell into the plug receptacle. The plug receptacle may connect to the off-panel electronics device to transfer the electrical current to the device.

In an embodiment, the contact may include a contact base that is laminated between a front layer and a back layer of the module laminate by a surrounding encapsulant. The plug receptacle may be adhered to the module laminate by an adhesive, and in an embodiment, the encapsulant and the adhesive are a same material, and are cured during a same lamination process. The plug receptacle may be mounted at different locations on the module laminate. For example, the plug receptacle may be adhered to a back surface of the PV module or along a lateral edge of the PV module. In an embodiment, one or more plug receptacles are integrated in a module frame that can be attached to the lateral edge of the PV module to form external electrical connectors for each of several sub-strings of PV cells of PV module.

Also by way of summary, disclosed herein is a method of manufacturing a PV module having an external electrical connector. In an embodiment, the method includes physically and/or electrically connecting a PV cell, an electrical conductor, and a contact between a front layer and a back layer of a PV module. For example, the contact may include a contact base between the front layer and the back layer, and a contact prong extending outward from the module laminate. The PV cell, the electrical conductor, and the contact may be surrounded by an encapsulant during a lamination process, and the encapsulant may be cured to bond the components together within a solidified module laminate. The contact prong may extend outward from the solidified module laminate. Thus, a plug receptacle may be mounted on the module laminate such that the contact prong extends through a contact slot of the plug receptacle into a plug channel of the plug receptacle. A mating connector, e.g., a connector of an external cable or an off-panel electronics device, may be received within the plug channel to electrically connect with the contact prong for electrical power transmission.

Figure 1:
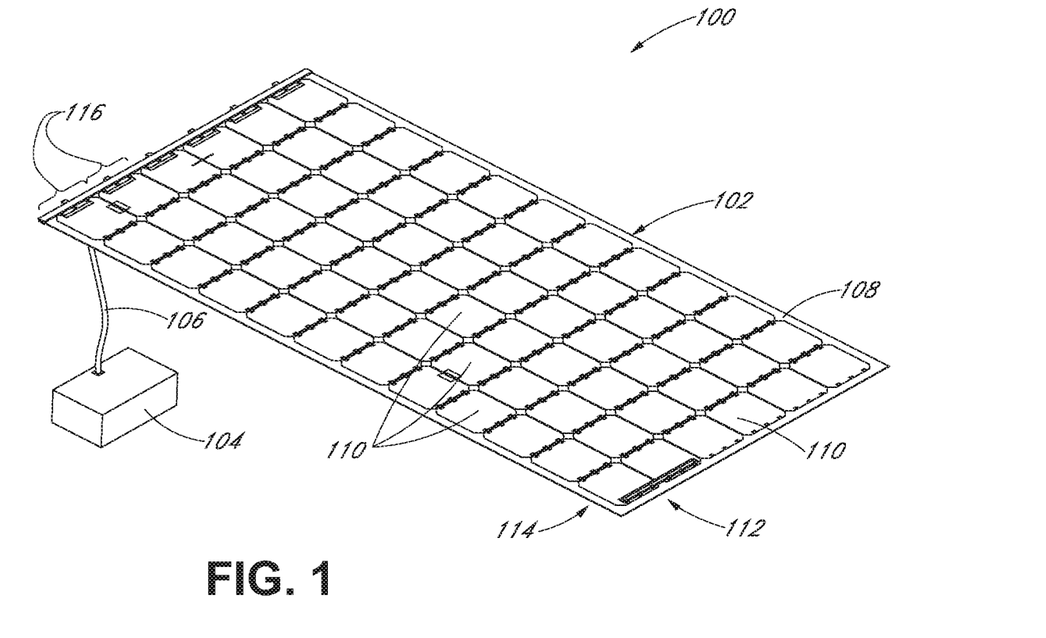
FIG. 1 illustrates a perspective view of a photovoltaic system having a photovoltaic module electrically connected to off-panel electronics through an external cable, in accordance with an embodiment of the present disclosure.

Referring to FIG. 1, a perspective view of a PV system having a PV module electrically connected to off-panel electronics through an external cable is shown in accordance with an embodiment of the present disclosure. A PV system 100 may include a PV module 102 electrically connected to an off-panel electronics device 104 by an external cable 106. More particularly, external cable 106 may extend from an external electrical connector (FIG. 3) of PV module 102 to off-panel electronics device 104. External cable 106 may have a mating connector to quickly connect and disconnect from PV module 102 and/or off-panel electronics device 104. The external electrical connector may include an electrical male or female connector, as described below, and the mating connector may have a corresponding male or female connector, to form a male-female connection.

Off-panel electronics device 104 may be easily removed from PV system 100 and replaced. By way of example, off-panel electronics device 104 may include one or more of a bypass diode, a microinverter, or a DC optimizer. Accordingly, the devices may be swapped out, e.g., when the bypass diode fails or when the microinverter or the DC optimizer are upgraded. Similarly, new and different module electronics may be easily added by connecting them to external cable 106. Thus, PV system 100 provides component interchangeability.

In an embodiment, PV module 102 includes a module laminate 108 having several PV cells 110 arranged in one or more cell row 112 and cell column 114. For example, module laminate 108 may include a string of PV cells 110 electrically connected in series, as is known. The string of PV cells 110 may be segmented into sub-string 116, which may include PV cells 110 arranged physically in parallel and electrically in series. That is, each substring may be electrically connected in series with an adjacent sub-string 116 such that an electrical current flows in a first direction through a first cell row 112 and the electrical current flows in a second direction, opposite to the first direction, through a second cell row 112, adjacent to the first cell row 112. As described below, in an embodiment, a first sub-string 116 may be connected to an adjacent sub-string 116 through external cable 106.

Figure 2:
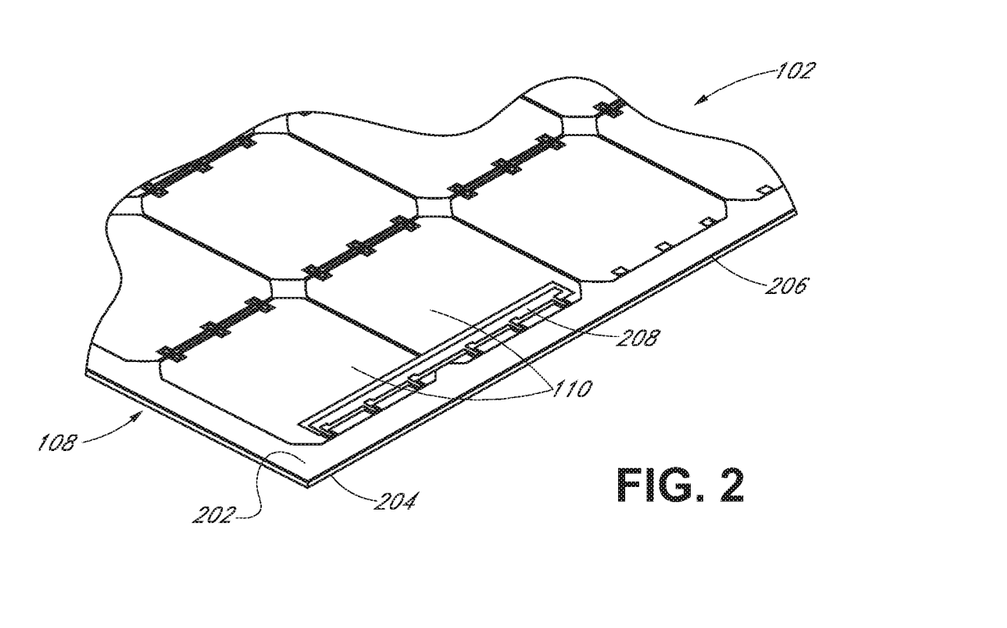
FIG. 2 illustrates a perspective view of in-panel module circuitry of a photovoltaic module, in accordance with an embodiment of the present disclosure.

Referring to FIG. 2, a perspective view of in-panel module circuitry of a PV module is shown in accordance with an embodiment of the present disclosure. Module laminate 108 of PV module 102 may include a front layer 202, e.g., a glass panel, parallel to and spaced apart from a back layer 204, e.g., a polymer sheet. More particularly, module laminate 108 may include parallel planar sheets having coextensive edges such that module laminate 108 has a lateral edge 206 extending around an outer perimeter of PV module 102.

PV module 102 may include a bus bar and/or an electrical conductor 208, e.g., an electrical ribbon, to carry electrical current away from PV cell 110. More particularly, electrical conductor 208 may be connected to a corresponding PV cell 110, e.g., by a weld or solder bond, between front layer 202 and back layer 204. For example, electrical conductor 208 may be electrically connected to one or more PV cells 110 located nearest to lateral edge 206. Thus, electrical conductor 208 may transfer electrical current generated by the corresponding PV cell 110. In an embodiment, electrical conductor 208 carries the electrical current generated by one or more sub-strings 116 of PV module 102 to a corresponding external electrical connector, such as the connectors described below.

Figure 3:
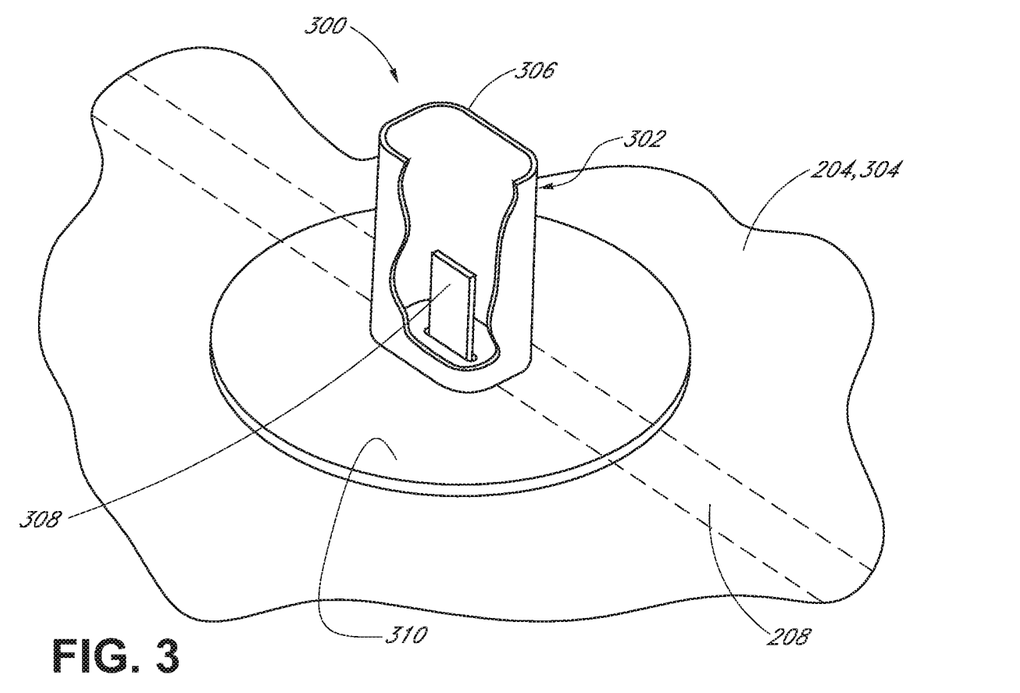
FIG. 3 illustrates a perspective cutaway view of an external electrical connector of a photovoltaic module, in accordance with an embodiment of the present disclosure.

Referring to FIG. 3, a perspective cutaway view of an external electrical connector of a PV module is shown in accordance with an embodiment of the present disclosure. External electrical connector 300 may be mounted on front layer 202 or back layer 204 of module laminate 108. More particularly, external electrical connector 300 may include a plug receptacle 302, and in an embodiment, plug receptacle 302 is attached to a back surface 304 of back layer 204 on module laminate 108. Plug receptacle 302 may provide a universal connector to attach to external cable 106 and off-panel electronics device 104 (FIG. 1), and accordingly, may include a plug casing 306 to engage with a mating connector of external cable 106 (FIG. 1). As described below, plug casing 306 may surround contact 308, and a base 310 of plug casing 306 may be adhered to or sealed against back surface 304. Accordingly, plug casing 306 may provide electrical and environmental protection to PV system 100 by preventing water ingress toward contact 308 or in-panel module circuitry when external electrical connector 300 is engaged with the mating connector of external cable 106.

Figure 4:
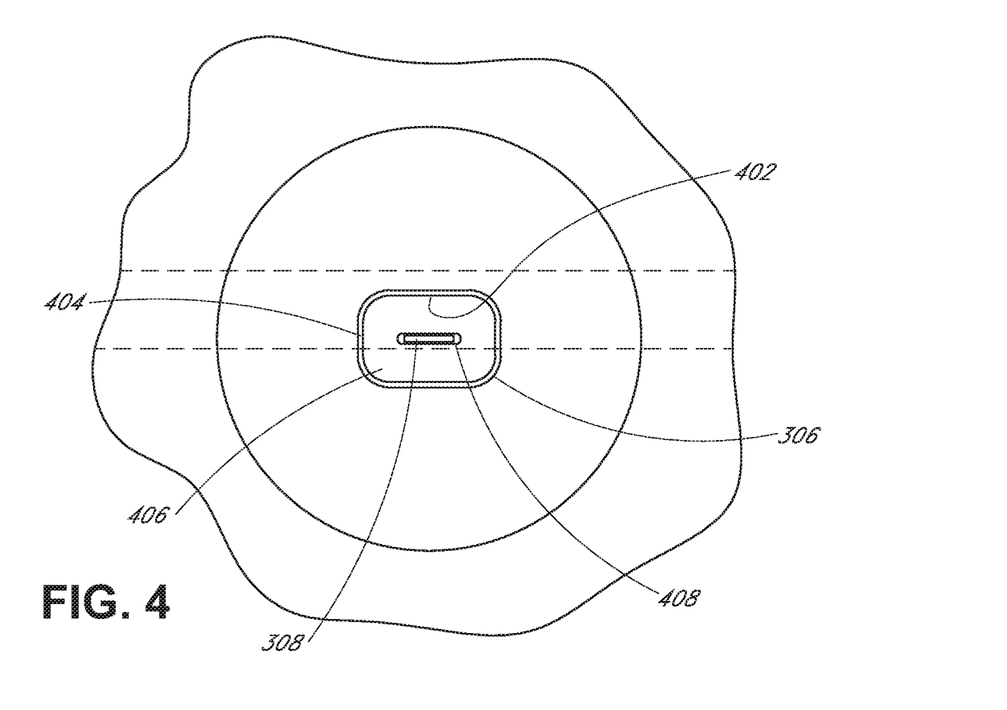
FIG. 4 illustrates a top view of an external electrical connector of a photovoltaic module, in accordance with an embodiment of the present disclosure.

Referring to FIG. 4, a top view of an external electrical connector of a PV module is shown in accordance with an embodiment of the present disclosure. In an embodiment, the mating connector of external cable 106 (FIG. 1) may be received in a plug channel 402 of plug casing 306. More particularly, plug casing 306 may include a casing wall 404 extending laterally around a central axis to define plug channel 402. Casing wall 404 may extend along a path of any shape, e.g., a circular path or the substantially rectangular path shown in FIG. 4, to form plug channel 402 having a cross-sectional area that conforms to a cross-sectional area of the mating connector. That is, plug casing 306 may include a cylindrical wall, a rectangular wall, etc., having an internal surface to receive an external surface of the mating connector in a sliding fit. Casing wall 404 may extend to a height above a base wall 406. Base wall 406 may be a portion of base 310 under plug casing 306. Thus, base wall 406 may be orthogonal to the central axis at a bottom end of plug channel 402.

Base wall 406 may have a contact slot 408 aligned with plug channel 402. For example, contact slot 408 may be an opening formed through base wall 406 from a side of base wall 406 facing plug channel 402 to a side of base wall 406 facing back surface 304. Contact slot 408 may be coaxially aligned with plug channel 402 along the central axis as shown, or contact slot 408 may be non-coaxial with, but inward from, plug channel 402. Accordingly, contact 308 may extend through contact slot 408 into plug channel 402 at a location laterally inward from casing wall 404.

Figure 5:
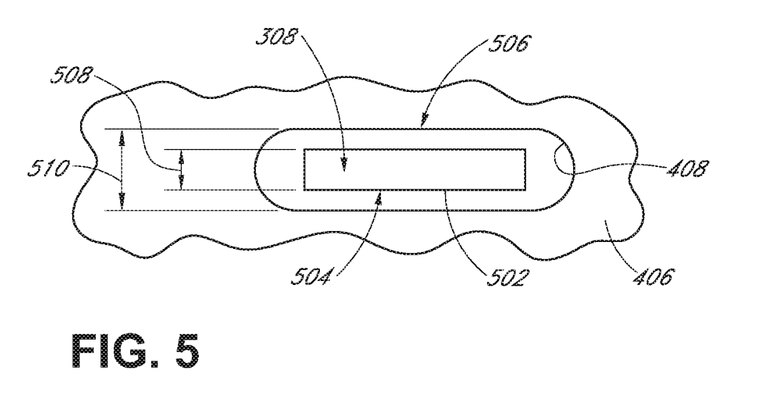
FIG. 5 illustrates a top view of a contact prong of a contact extending through a contact slot of a plug receptacle, in accordance with an embodiment of the present disclosure.

Referring to FIG. 5, a top view of a contact prong of a contact extending through a contact slot of a plug receptacle is shown in accordance with an embodiment of the present disclosure. Contact slot 408 in base wall 406 of plug receptacle 302 may be sized to support contact 308 against lateral bending. For example, contact 308 may include a contact prong 502 extending through contact slot 408 into plug channel 402, and contact prong 502 may be similarly sized to contact slot 408 such that base wall 406 around contact prong 502 reinforces a column strength of contact prong 502. Accordingly, contact prong 502 may include a contact cross-sectional area 504, i.e., a profile around an axis passing through contact prong 502, and contact slot 408 may include a similarly sized slot cross-sectional area 506, i.e., a profile around the axis and contact cross-sectional area 504. That is, slot cross-sectional area 506 may conform to contact cross-sectional area 504. For example, a contact width 508, i.e., a lateral dimension across contact cross-sectional area 504 may be similar to a slot width 510, i.e., a lateral dimension across slot cross-sectional area 506. Contact width 508 may be preselected to provide contact prong 502 with a desired stiffness. In an embodiment, contact width 508 is at least 75% of slot width 510. Thus, contact cross-sectional area 504 may be smaller than slot cross-sectional area 506, and a gap may be present between base wall 406 and contact prong 502. The gap may be optimized to allow plug casing 306 to be easily inserted over contact prong 502 and to support contact prong 502 laterally when a mating connector is engaged with external electrical connector 300.

It will be appreciated that contact prong 502 of contact 308 may be a male or a female contact. In the accompanying figures, contact prong 502 is illustrated as a male tab contact, e.g., a blade type contact, however, in some embodiments contact prong 502 may be a female receptacle contact, e.g., a pair of lances positioned to receive a male tab contact of the mating connector of external cable 106 (FIG. 1). Such variations in contact design will be apparent to one skilled in the art. For example, it would be understood that contact 308 may include a base material, such as $CuSn_4$ or $CuFe_2$, covered by a plating, e.g., a tin, silver or gold plating. Accordingly, further description of such details is omitted here for the sake of brevity. Whether contact prong 502 is a male or a female contact, however, contact prong 502 may extend through contact slot 408 and be supported by base wall 406.

Figure 6:
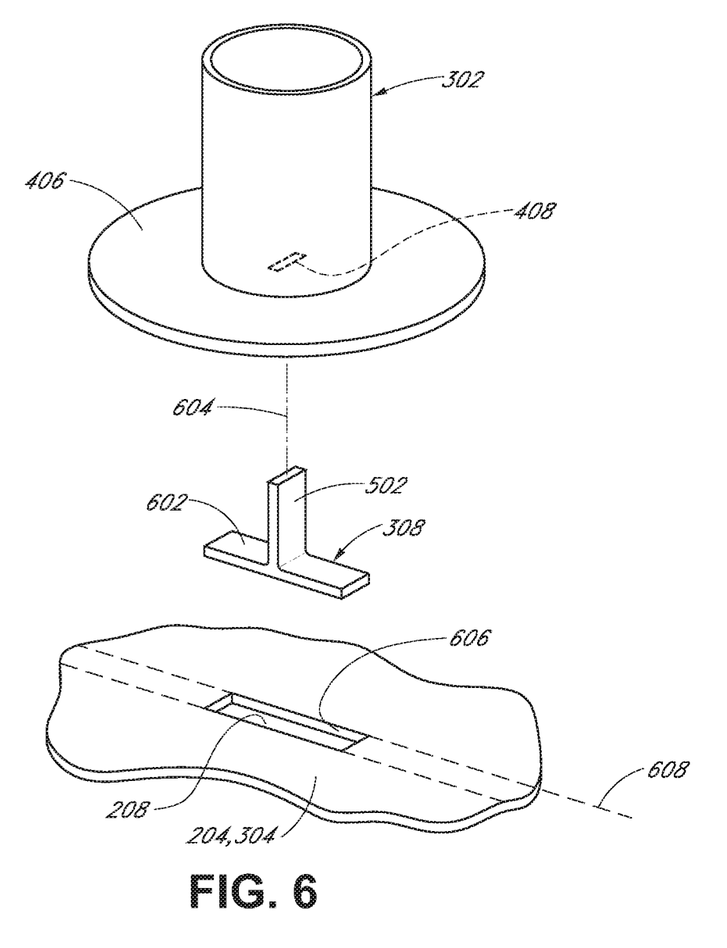
FIG. 6 illustrates an exploded view of an external electrical connector of a photovoltaic module, in accordance with an embodiment of the present disclosure.

Referring to FIG. 6, an exploded view of an external electrical connector of a PV module is shown in accordance with an embodiment of the present disclosure. Contact prong 502, e.g., a male contact tab, may extend orthogonally to a contact base 602 of contact 308. For example, contact 308 may be T-shaped such that contact base 602 forms the horizontal bar of the T-shape, and contact prong 502 forms the vertical bar of the T-shape. Accordingly, contact base 602 may be parallel to back surface 304 of module laminate 108, and contact prong 502 may extend orthogonally to back surface 304 along a contact axis 604. More particularly, contact axis 604 may be aligned with contact slot 408 to allow plug receptacle 302 to be placed over contact 308 and onto back surface 304.

In an embodiment, a back sheet opening 606 may be formed in back layer 204 of module laminate 108, over electrical conductor 208. Electrical conductor 208 may extend along a conductor axis 608, e.g., in a direction orthogonal to contact axis 604. Thus, contact prong 502 may have a prong stiffness about contact axis 604, and electrical conductor 208 may have a conductor stiffness about conductor axis 608. In contrast to typical electrical connections that bring an electrical conductor 208, such as an electrical pigtail, out of the backsheet of a PV module 102, the exposed portion of the in-panel module circuitry, e.g., contact 308, may have a greater stiffness than the portion of the in-panel module circuitry inside of module laminate 108, e.g., electrical conductor 208. More particularly, the prong stiffness may be greater than the conductor stiffness. Furthermore, as described above, contact prong 502 may be supported by base wall 406, and thus, a column strength of contact prong 502 may be substantially greater than a column strength of electrical conductor 208.

Backsheet opening 606 may have a profile that is larger than a profile of contact base 602. For example, backsheet opening 606 may be a rectangular hole formed through back layer 204 over electrical conductor 208, and the rectangular hole may have a width and a length. Contact base 602 may have a rectangular, or any other shaped, profile that includes a width and a length that is less than the width and the length of the rectangular hole through back layer 204. Accordingly, contact 308 may be inserted through backsheet opening 606 onto electrical conductor 208.

In an embodiment, backsheet opening 606 is formed in back layer 204 using an automated process. For example, backsheet opening 606 may be punched into back layer 204 using a punching press. Accordingly, backsheet opening 606 may be a highly repeatable feature located anywhere in back layer 204. Thus, the routing of contacts 308 through backsheet opening 606 may be easier and less costly to perform as compared to routing an electrical ribbon through a manually slit passage in a backsheet of a PV module.

Figure 7:
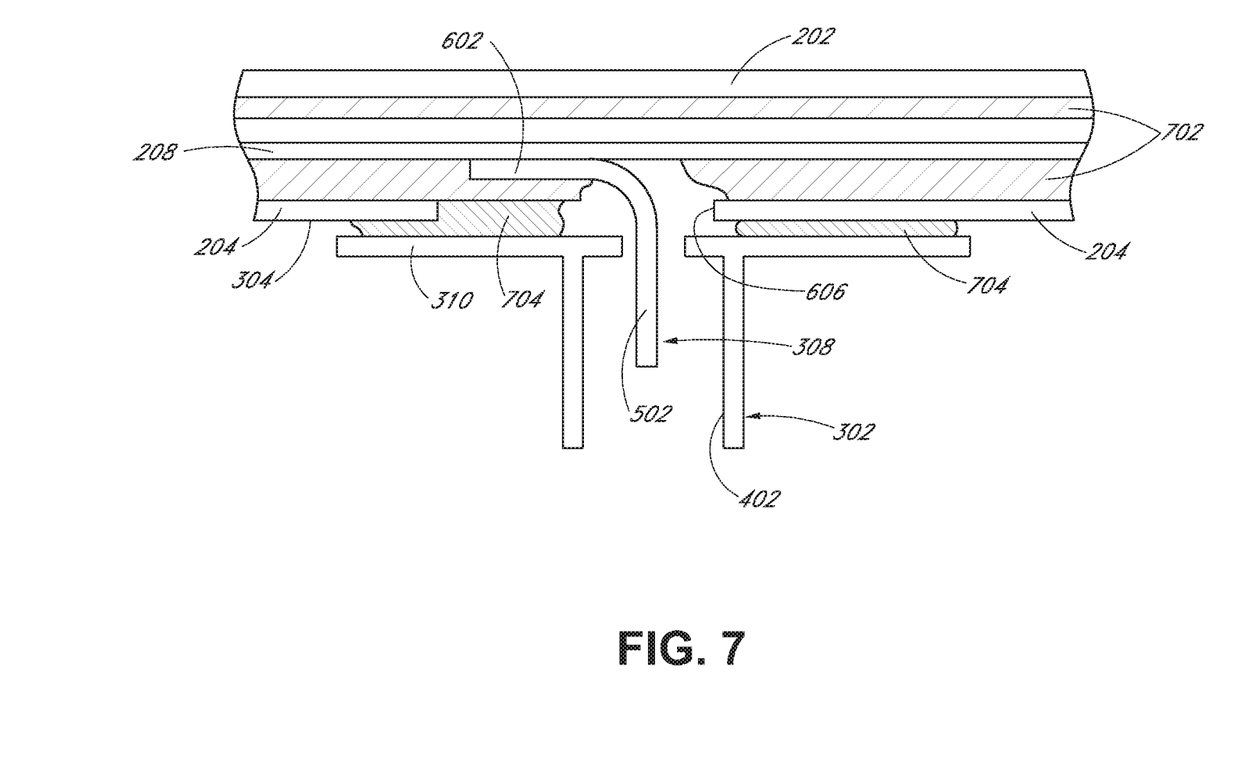
FIG. 7 illustrates a cross-sectional view of a plug receptacle mounted on a module laminate, in accordance with an embodiment of the present disclosure.

Referring to FIG. 7, a cross-sectional view of a plug receptacle mounted on a module laminate is shown in accordance with an embodiment of the present disclosure. When contact 308 is inserted through backsheet opening 606 in back layer 204, contact base 602 may be attached to electrical conductor 208. For example, contact 308 may have an L-shape, and the horizontal bar of the L-shape may be permanently attached, e.g., welded or soldered, to a portion of electrical conductor 208 exposed through backsheet opening 606. Alternatively, a physical connection between contact base 602 and electrical conductor 208 may be formed by pressing the components together and encapsulating the abutting components, as described below. Accordingly, contact 308 may be electrically connected to electrical conductor 208. Contact prong 502 may be the vertical bar of the L-shape and may extend outward from electrical conductor 208 through backsheet opening 606 in back layer 204. Accordingly, contact prong 502 may provide an external contact point to interface with the mating connector of external cable 106 (FIG. 1).

In an embodiment, at least a portion of contact 308 may be encapsulated within module laminate 108. For example, an encapsulant 702 used to encapsulate PV cell 110 between front layer 202 and a back layer 204 may also surround contact base 602 and electrical conductor 208 between front layer 202 and back layer 204. More particularly, encapsulant 702 may fill a space between PV cell 110 and back layer 204 within which contact base 602 is located. Accordingly, encapsulant 702 may bind contact 308 to the rest of module laminate 108 during a same lamination process used to form module laminate 108.

Plug receptacle 302 may also be adhered to module laminate 108. For example, plug receptacle 302 may be placed over contact 308 such that contact prong 502 extends into plug channel 402 and an upper surface of base 310 faces back surface 304 of back layer 204. That is, plug receptacle 302 may be mounted on back surface 304 of back layer 204. In an embodiment, an adhesive 704 is disposed between plug receptacle 302 and module laminate 108. For example, adhesive 704 may form an adhesive joint between base 310 and back layer 204 to bond plug receptacle 302 to module laminate 108. Adhesive 704 may include a heat cured adhesive or a light cured material. For example, adhesive 704 may be a same heat cured material as encapsulant 702, e.g., a thermoplastic olefin such as polyethylene. Alternatively, adhesive 704 may be a UV cured adhesive, and plug receptacle 302 may be formed from a translucent material to allow ultraviolet light to penetrate toward adhesive 704 during a curing operation. Thus, plug receptacle 302 may be permanently bonded to back layer 204 during a same or a different operation as the lamination process used to form module laminate 108. As a result, external electrical connector 300 may be built directly into PV module 102 to convey electrical current outward from PV cells 110 of PV module 102 to an external connection point with external cable 106 and/or off-panel electronics device 104 (FIG. 1).

Figure 8:
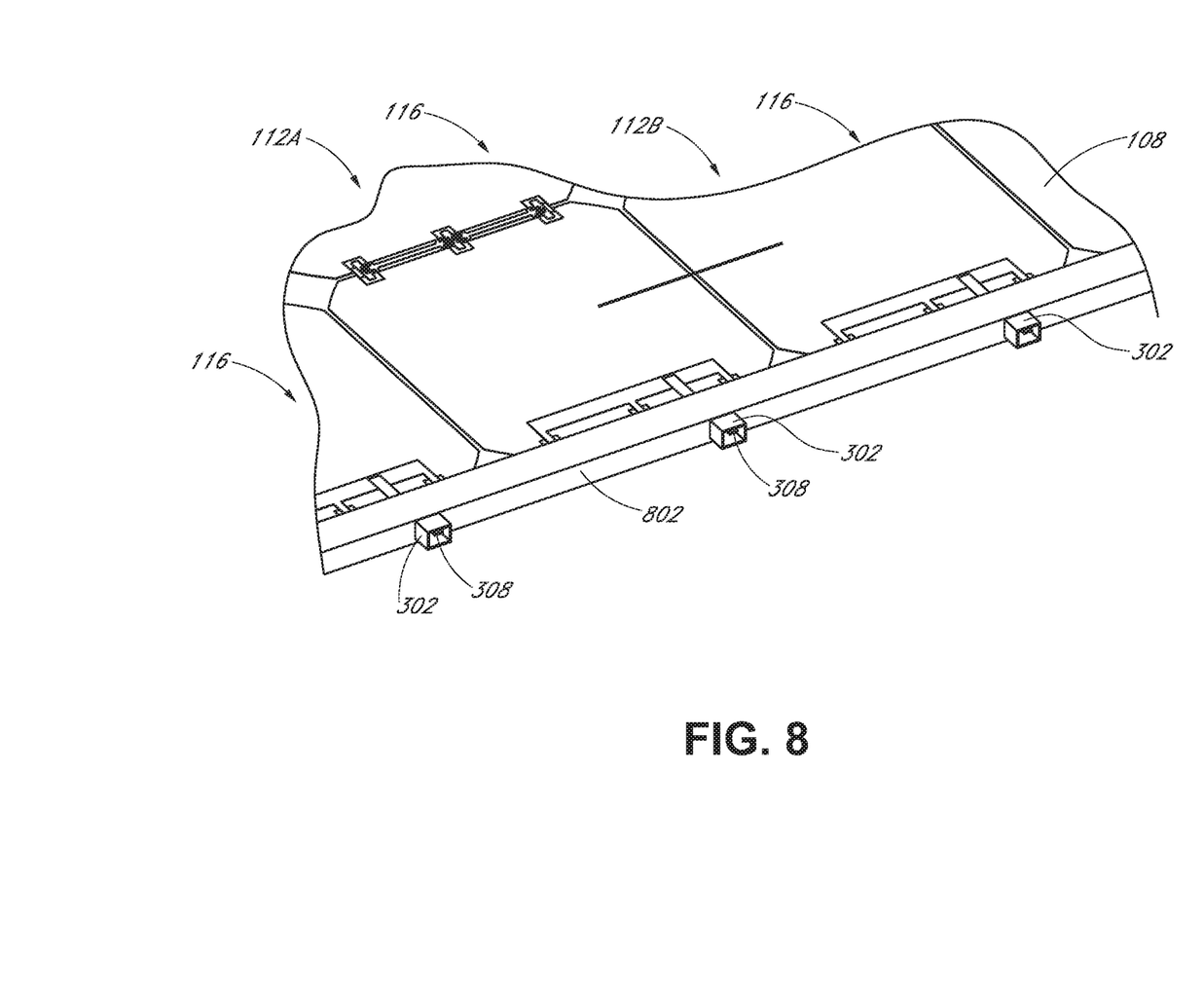
FIG. 8 illustrates a perspective view of a module frame having a plug receptacle mounted on a module laminate, in accordance with an embodiment of the present disclosure.

Referring to FIG. 8, a perspective view of a module frame having a plug receptacle mounted on a module laminate is shown in accordance with an embodiment of the present disclosure. External electrical connector 300 is described above in the context of a connector that brings electrical current through back layer 204 of module laminate 108 to an external connection point. External electrical connector 300 may, however, bring the electrical current from PV cells 110 in any direction. In an embodiment, one or more plug receptacles 302 is mounted on lateral edge 206 (hidden) of module laminate 108. For example, PV system 100 may include a module frame 802 mounted along lateral edge 206 of module laminate 108 to support PV module 102 at an installation site, e.g., for mounting on a roof. Module frame 802 may include several plug receptacles 302. That is, plug receptacles 302 may be integrally formed with module frame 802, e.g., during a frame molding or casting process.

Plug receptacles 302 mounted along lateral edge 206 may be aligned with respective PV cell rows 112 or columns 114. For example, module laminate 108 may include a first sub-string 116 of PV cells arranged along a first cell row 112A, and a second sub-string 116 of PV cells arranged along the second cell row 112B. A first plug receptacle 302 may be aligned with the first cell row 112A to receive a first contact 308 electrically connected to the first cell row 112A, and a second plug receptacle 302 may be aligned with the second cell row 112B to receive a second contact 308 electrically connected to the second cell row 112B. As such, rather than being electrically in-series in an ordinary manner, the cell rows 112A, 112B may be electrically in parallel because the respective contacts 308 may not be electrically connected. Accordingly, an electrical connection may be established between cell rows 112 by external cable 106 and/or off-panel electronics device 104 (FIG. 1). For example, external cable 106 may include mating connectors at each of two ends, and the mating connectors may be engaged with the respective plug receptacles 302 to electrically connect the sub-strings 116 in series. Alternatively, the mating connectors may be engaged with respective plug receptacles 302 of every few sub-strings 116, and a bypass diode may be electrically in-series with external cable 106, to place the bypass diode in parallel with one or more sub-strings 116 such that the electrical current passes through the bypass diode when a sub-string 116 shuts down.

Figure 9:
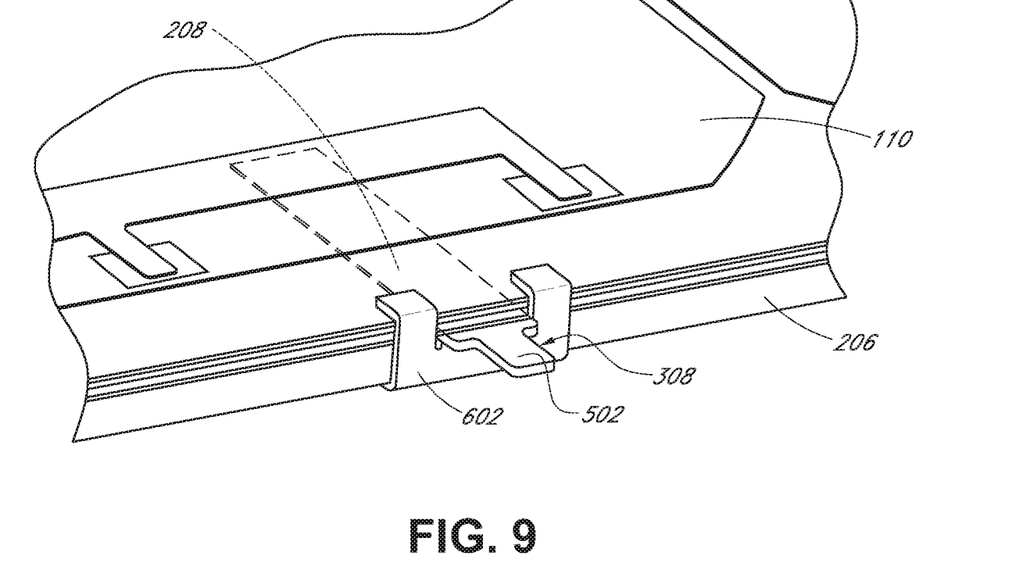
FIG. 9 illustrates a perspective view of a contact mounted on a lateral edge of a module laminate, in accordance with an embodiment of the present disclosure.

Referring to FIG. 9, a perspective view of a contact mounted on a lateral edge of a module laminate is shown in accordance with an embodiment of the present disclosure. Contact 308 may be mounted along lateral edge 206 of PV module 102. More particularly, contact base 602 may have a clip structure, e.g., a U-shaped cross-sectional structure, to engage module laminate 108. Contact prong 502 may extend laterally outward from module laminate 108. In an embodiment, contact prong 502 is electrically connected to electrical conductor 208 within the laminate structure of module laminate 108. Alternatively, electrical conductor 208 may extend outward from lateral edge 206 to connect to contact base 602. Thus, contact 308 may carry electrical current from PV cell 110 laterally outward toward an external connection point.

Figure 10:
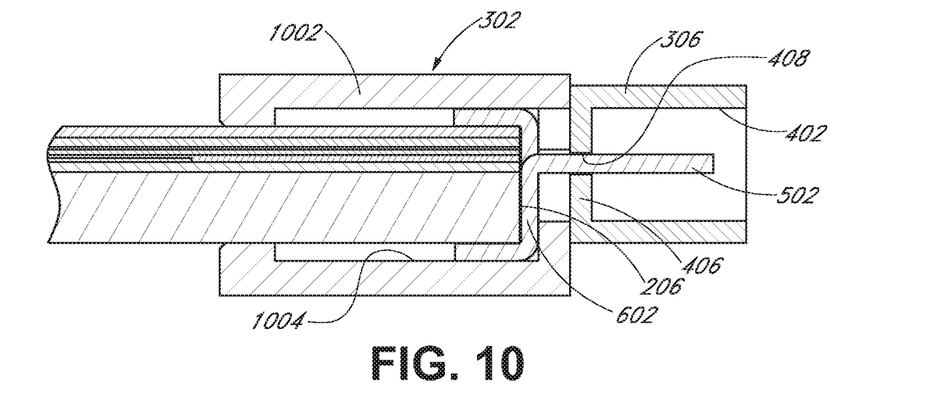
FIG. 10 illustrates a cross-sectional view of a module frame having a plug receptacle mounted on a module laminate, in accordance with an embodiment of the present disclosure.

Referring to FIG. 10, a cross-sectional view of a module frame having a plug receptacle mounted on a module laminate is shown in accordance with an embodiment of the present disclosure. Module frame 802 may be installed over contacts 308 mounted along lateral edge 206. For example, plug receptacle 302 of external electrical connector 300 may include a mount casing 1002 to attach to lateral edge 206. More particularly, mount casing 1002 may be integral to module frame 802, and may be sized and shaped to click into place around contact base 602. That is, mount casing 1002 may have a U-shaped cross-sectional structure around a contact channel 1004, and contact channel 1004 may be sized to receive contact base 602 of contact 308. In an embodiment, a filler, such as a silicone-based adhesive, may be disposed within the contact channel 1004 to fill a space between mount casing 1002 and module laminate 108. The adhesive filler may secure module frame 802 to module laminate 108, and may seal around module laminate 108 to prevent water ingress into contact channel 1004 and toward in-panel module circuitry.

Mount casing 1002 may surround contact channel 1004 on an opposite side of base wall 406 from plug channel 402 within plug casing 306. Thus, plug receptacle 302 may receive contact prong 502 through contact slot 408 in base wall 406 when mount casing 1002 straddles module laminate 108. In such case, contact base 602 may be retained in contact channel 1004 between base wall 406 and lateral edge 206, and contact prong 502 may extend through contact slot 408 into plug channel 402. Thus, by engaging module frame 802 with lateral edge 206 of module laminate 108 over contact 308, an external electrical connector 300 is formed along lateral edge 206 of module laminate 108.

When module frame 802 incorporates several plug receptacles 302, engaging module frame 802 with lateral edge 206 may form several external electrical connectors 300 aligned with respective sub strings of PV module 102. That is, when module frame 802 is clicked into place over lateral edge 206, a second plug receptacle 302 may be mounted on module laminate 108 over a second contact 308 electrically connected to a second PV cell sub-string 116. The second contact 308 may extend through a contact slot 408 in a base wall 406 of the second plug receptacle 302. Thus, a first external electrical connector 300 may be formed simultaneously with a second external electrical connector 300 in a single frame mounting operation.

Figure 11:
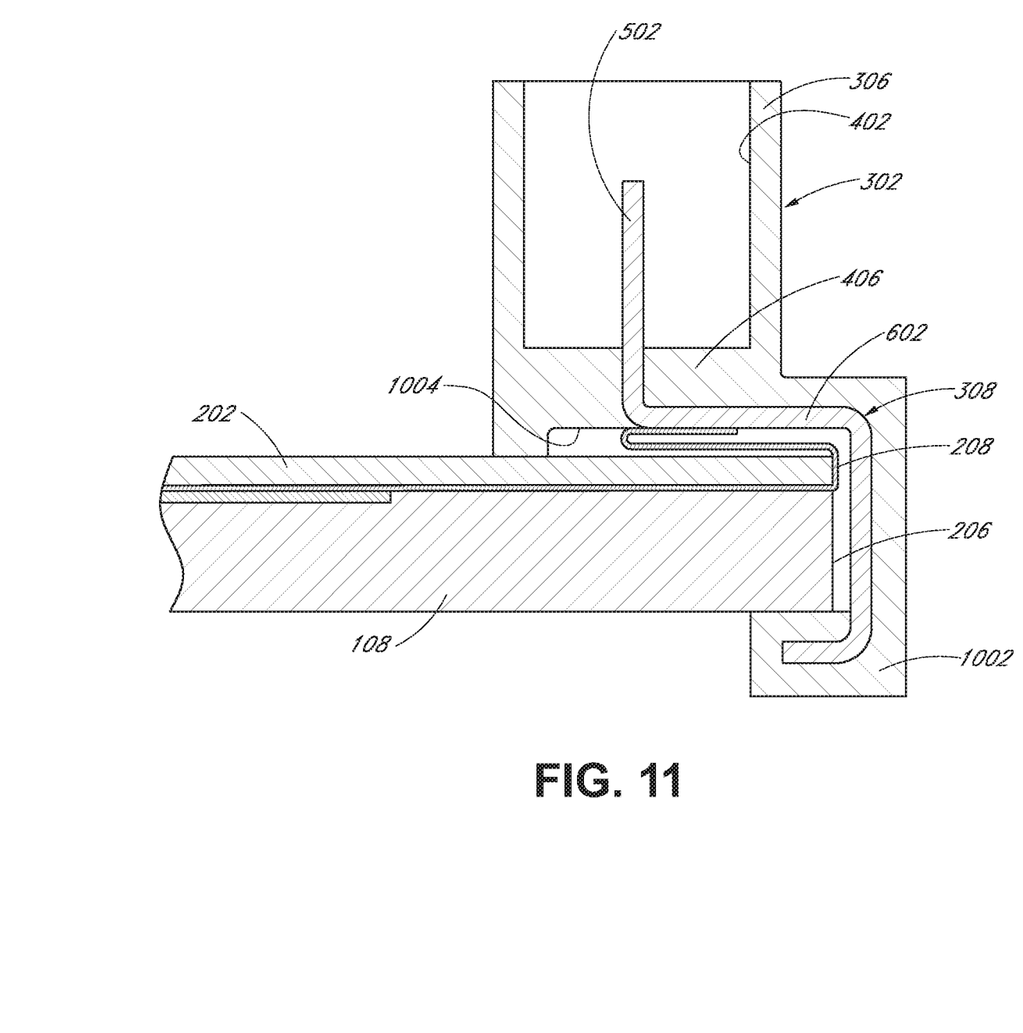
FIG. 11 illustrates a cross-sectional view of a plug receptacle having a mount casing attached to a module laminate, in accordance with an embodiment of the present disclosure.

Referring to FIG. 11, a cross-sectional view of a plug receptacle having a mount casing attached to a module laminate is shown in accordance with an embodiment of the present disclosure. Plug receptacle 302 may include plug casing 306 around plug channel 402 on a first side of base wall 406, and mount casing 1002 around contact channel 1004 on an opposite side of base wall 406. In an embodiment, mount casing 1002 attaches directly to lateral edge 206 of module laminate 108 to provide contact channel 1004 between plug receptacle 302 and module laminate 108. Accordingly, electrical conductor 208 may be routed through lateral edge 206 into contact channel 1004. Furthermore, electrical conductor 208 may be folded and protected within contact channel 1004. As a result, electrical conductor 208 may have sufficient length to make assembly to contact 308 easier to perform, since it may be folded into a lower profile after the contact is complete.

Electrical conductor 208 may be routed through contact channel 1004 to a connection point with contact 308. In an embodiment, contact 308 has a profile such that contact base 602 extends around lateral edge 206 of module laminate 108, and contact prong 502 extends into plug channel 402. A portion of contact base 602 may be parallel to front layer 202, and contact prong 502 may extend upward from contact base 602. Mount casing 1002 may have a profile similar to contact base 602, i.e., mount casing 1002 may wrap around lateral edge 206 of module laminate 108. In an embodiment, contact base 602 is embedded in mount casing 1002. For example, contact base 602 may be a metallic part overmolded within a plastic mount casing 1002. Accordingly, mount casing 1002 and/or contact base 602 may clip onto lateral edge 206 to hold external electrical connector 300 in place relative to module laminate 108.

Electrical current may be carried horizontally outward from PV module 102 in a lateral direction, and contact prong 502 may carry the electrical current vertically upward in a forward or backward facing direction orthogonal to the lateral direction. Thus, external electrical connector 300 may be mounted at any location on PV module 102 to carry electrical current outward from one or more PV cell sub-strings 116 in a routing direction, e.g., horizontally, and external electrical connector 300 may be shaped to receive a mating connector in a direction different than the routing direction, e.g., vertically.

Figure 12:
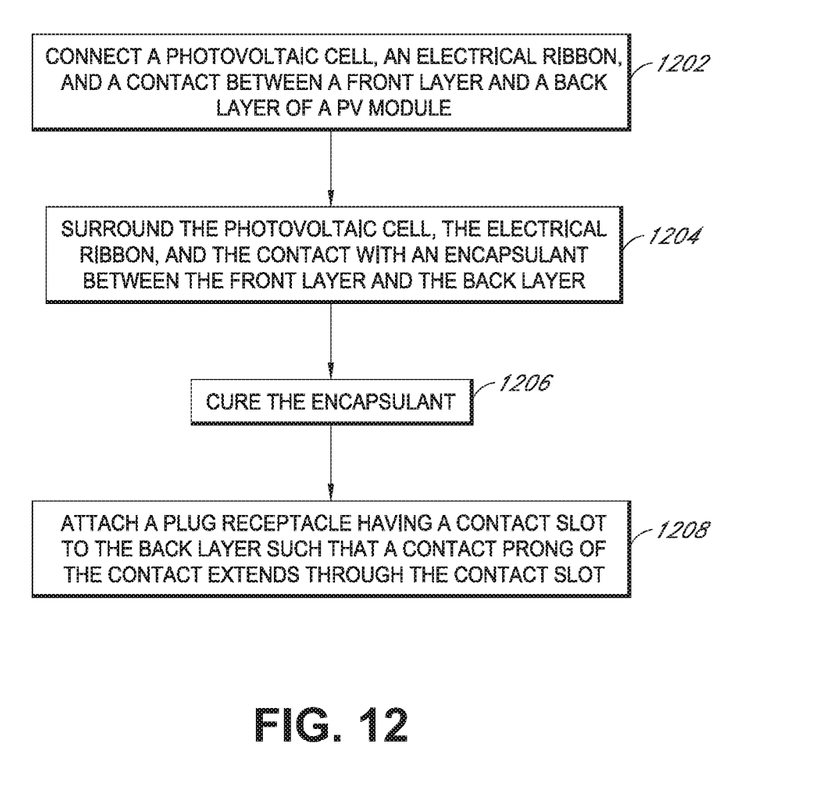
FIG. 12 illustrates a flowchart of a method of manufacturing a photovoltaic module having an external electrical connector, in accordance with an embodiment of the present disclosure.

Referring to FIG. 12, a flowchart of a method of manufacturing a PV module having an external electrical connector is shown in accordance with an embodiment of the present disclosure. At operation 1202, PV cell 110, electrical conductor 208, and contact 308 may be connected between front layer 202 and back layer 204 of PV module 102. More particularly, an electrical connection between PV cell 110, electrical conductor 208, and contact base 602 may be formed within module laminate 108. The electrical connection may include a physical connection between the components. For example, connecting PV cell 110, electrical conductor 208, and contact 308, may include welding or soldering contact base 602 to electrical conductor 208 and/or welding or soldering electrical conductor 208 to PV cell 110. The electrical connection, however, may be formed through physical contact of the components without a weld or solder bond. For example, a lamination process may apply sufficient pressure between contact base 602 and electrical conductor 208 to form an electrical connection, and the components may be held in contact by an encapsulant such that a secondary weld is unnecessary.

As described above, contact 308 may be inserted through back sheet opening 606 to be placed in contact with electrical conductor 208. Alternatively, the physical connection between electrical conductor 208 and contact 308 may be formed before adding back layer 204 to the module stack-up. For example, at operation 1204, PV cell 110, electrical conductor 208, and contact 308 may be held together and surrounded by encapsulant 702 between front layer 202 and back layer 204. A first layer of encapsulant 702 may be layered between front layer 202 and PV cell 110, and a second layer of encapsulant 702 may be layered over a back side of PV cell 110, and over the electrically connected electrical conductor 208 and contact base 602. Back layer 204 may then be installed such that back sheet opening 606 aligns with contact prong 502, and the second encapsulant 702 is sandwiched between front layer 202 and back layer 204. When encapsulant 702 is squeezed between front layer 202 and back layer 204, it may spread evenly around the in-panel module circuitry within the laminate structure. Accordingly, contact base 602 may be encapsulated between front layer 202 and back layer 204, and contact prong 502 may extend outward through back sheet opening 606 to a connection point outside of module laminate 108.

In an embodiment, contact prong 502 may be protected during the encapsulation operation described above. For example, contact prong 502 may be covered by a protector before surrounding PV cell 110, electrical conductor 208, and contact 308 with encapsulant 702. By way of example, the protector may be an electrically insulating cap that is placed over contact prong 502 before squeezing encapsulant 702 between front layer 202 and back layer 204. Accordingly, when pressure is applied to encapsulant 702, to force encapsulant 702 to reflow and surround the in-panel module circuitry, the protective cap may isolate contact prong 502 to maintain contact prong 502 in an uncoated and electrically conductive state.

At operation 1206, encapsulant 702 may be cured. Curing may be through a heat process or by ultraviolet light irradiation of encapsulant 702. Accordingly, encapsulant 702 may harden to bind the laminate structure together and to retain in-panel module circuitry, e.g., contact 308, in an electrically connected state to PV cell sub-strings 116.

At operation 1208, plug receptacle 302 may be mounted on back layer 204. For example, plug receptacle 302 may be inserted over contact 308 by passing contact prong 502 through contact slot 408. Base 310 of plug receptacle 302 may be attached to back surface 304 of back layer 204. Adhesive 704 may be used to form the attachment between plug receptacle 302 and back layer 204. That is, adhesive 704 may be applied between plug receptacle 302 and back layer 204, and adhesive 704 may then be cured to form a bond between the components. As described above, adhesive 704 may be a same material as encapsulant 702, and thus, may be applied and cured at the same time that encapsulant 702 is applied and cured between front layer 202 and back layer 204. Alternatively, adhesive 704 may be applied and cured as a secondary operation after module laminate 108 is formed by the lamination process. Accordingly, PV module 102 having external electrical connector 300 to receive a mating connector of external cable 106 or off-panel electronics device 104, may be fabricated.

The operations of the method of manufacturing a PV module having an electrical connector for off-panel electronics, as shown in FIG. 12, may be performed in a different sequence. For example, assembly of the components of the electrical circuit may be performing in the front end of the process, prior to performing a lamination and/or curing operation.

At operation 1202, backsheet opening 606 may be formed in back layer 204 to provide a hole or space for insertion of contact 308. Contact base 602 may be inserted into backsheet opening 606, and contact 308 may be welded or otherwise physically and electrically connected to electrical conductor 208 (or directly to PV cell 100) to form the cell circuit.

In an embodiment, operation 1208 may immediately follow operation 1202, and plug receptacle 302 may be mounted on back layer 204. More particularly, base 310 may be attached to back surface 304, e.g., by an adhesive bond. Contact prong 502 may thus pass through contact slot 408 into contact channel 1004. Accordingly, an electrical circuit for an external connection to PV module 102 may be formed prior to completing a sealing operation during a lamination/curing operation.

At operation 1204, PV cell 110, electrical conductor 208, and contact 308 may be held together and surrounded by encapsulant 702 between front layer 202 and back layer 204, as described above. Encapsulant 702 may likewise surround a portion of plug receptacle 302, e.g., base 310. Then, at operation 1206, encapsulant 702 may be cured to complete the lamination process. The cured encapsulant 702 may securely bind electrical conductor 208, contact 308, back layer 204, and plug receptacle 302 together. Accordingly, the operations of FIG. 12 may be performed in a variety of sequences to manufacture PV module 102 having an external electrical connector for off-panel electronics.

The methods described above can differ from a typical module manufacturing process used today. Existing methods include forming a PV laminate having electrical ribbons passing through a hole in a backsheet or edge of a PV panel, and then attaching a junction box to the already-laminated and cured PV panel using an adhesive. It will be appreciated that an advantage of the above-described methods over the existing manufacturing methods includes an ability to embed on-module electronics into the laminate of PV module 102. For example, DC optimizers having a size of a small microchip may be embedded within or mounted on PV module 102 and connected to electrical conductor 208 during a manufacturing method. Embedding or mounting of the on-panel electronics may be performed before a lamination/curing operation.

Figure 13:
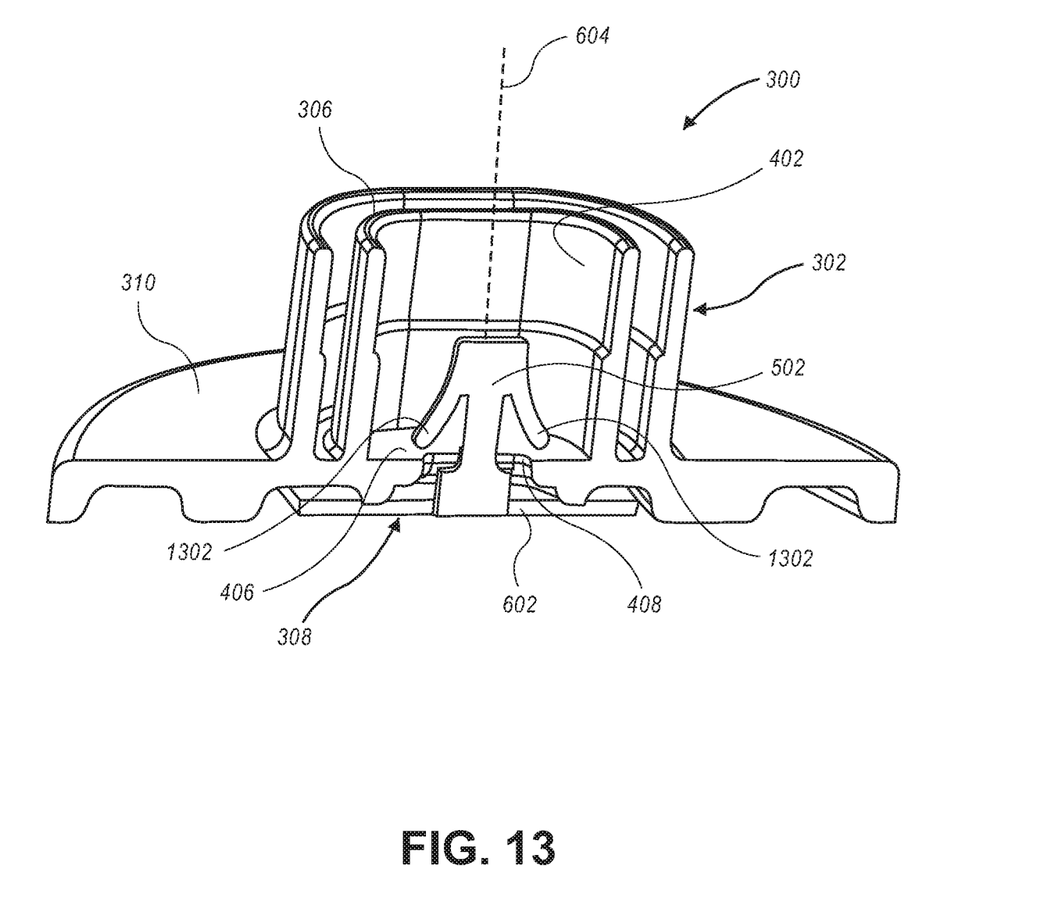
FIG. 13 illustrates a perspective cross-sectional view of an external electrical connector of a photovoltaic module, in accordance with an embodiment of the present disclosure.

Referring to FIG. 13, a perspective cross-sectional view of an external electrical connector of a photovoltaic module is shown in accordance with an embodiment of the present disclosure. External electrical connector 300 may include a contact 308 that retains plug receptacle 302. More particularly, contact 308, which may be bound to module laminate 108 as described above, may hold plug receptacle 302 in place relative to and/or against module laminate 108 of PV module 102. Components of external electrical connector 300 having a self-retaining feature may be similar to those described above. For example, plug receptacle 302 may include base 310 mounted on module laminate 108 (not shown), and plug casing 306 extending from base 310 to form plug channel 402 for receiving an external plug. Furthermore, contact 308 may include contact prong 502 extending from contact base 602. Contact base 602 may be attached to electrical conductor 208 (not shown) within module laminate 108, and thus, contact prong 502 may extend along contact axis 604 through contact slot 408 into plug channel 402. In an embodiment, at least a portion of contact base 602 may be held between front layer 202 and back layer 204, such that a retaining force is applied to contact 502. More particularly, contact 502 may resist removal from module laminate 108, e.g., when a plug attached to external cable 106 is pulled away from external electrical connector 300.

In an embodiment, contact prong 502 may transmit the retention force to plug receptacle 302. For example, contact prong 502 may include one or more retention tabs 1302 that extend laterally away from contact axis 604 and are disposed above base wall 406. When a removal force is applied to plug receptacle 302, e.g., when the plug of external cable 106 applies a frictional removal force to plug casing 306, base wall 406 may contact a tip of retention tab(s) 1302, and thus, retention tab(s) 1302 may press downward on base wall 406 to retain plug receptacle 302 against module laminate 108. Accordingly, the in-laminate contact 308 may hold down the housing provided by plug receptacle 302.

Retention tab 1302 may flex inward from the retaining state shown in FIG. 13 to an insertion/removal state (not shown). More particularly, retention tabs 1302 may flex laterally inward toward contact axis 604 until a distance between the tips of retention tabs 1302 is less than a width of contact slot 408. Accordingly, retention tabs 1302 may allow plug receptacle 302 to be mounted and removed from module laminate 108 over contact prong 502 by sliding contact slot 408 over contact prong 502 to transition retention tabs 1302 between the retaining state and the insertion/removal state.

Retention tabs 1302 of FIG. 13 are representative of a retention feature that may be integrated in contact 308 to retain plug receptacle 302. That is, the retention tabs 1302 are illustrative and not limiting. Alternative retention features may be contemplated. For example, contact prong 502 may include a cylindrical core, and a thread feature may revolve around the core to provide a threaded fastener feature. Accordingly, contact slot 408 may have a mating threaded surface to allow plug receptacle 302 to be screwed onto contact prong 502 and retained against module laminate 108. Accordingly, numerous alternative configurations of external electrical connector 300 may be contemplated within the scope of this description.

Retention tabs 1302 may be conductive or non-conductive, and may be integral to contact prong 502 or separate from contact prong 502. For example, contact prong 502 and retention tabs 1302 may be fabricated as separate portions of a monolithic conductive form, e.g., a metallic shim that is cut and bent into a desired shape, and may therefore both be electrically conductive. Alternatively, contact prong 502 may be fabricated from an electrically conductive material, and retention tabs 1302 may be formed from a polymeric insulating material. Retention tabs 1302 may be overmolded onto contact prong 502. Thus, retention tabs may be fabricated from a material that is selected for flexibility and/or resilience to fulfill a retention function, and contact prong 502 may be fabricated from a material that is selected for electrical conductivity to fulfill an electrical connection function.

A retention feature of external electrical connector 300 may penetrate back layer 204 of module laminate 108. For example, retention tabs 1302 may extend through an opening formed in back layer 204 and may be in-laminated within module laminate 108. Accordingly, a retention force may be transmitted from module laminate 108 through the retention feature, as well as through contact prong 502 attached to contact base 602, to plug receptacle 302.

PV modules having external electrical connectors have been described. Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A photovoltaic module, comprising:
   a module laminate including a photovoltaic cell electrically connected to an electrical conductor between a front outer planar layer and a back outer planar layer;
   a plug receptacle, the plug receptacle positioned within at least a portion of at least one of a perimeter of the front outer planar layer or a perimeter of the back outer planar layer and the plug receptacle mounted on at least one of the front outer planar layer or the back outer planar layer of the module laminate, wherein the plug receptacle includes a plug casing around a plug channel, and a base wall having a contact slot aligned with the plug channel; and a contact including a contact base attached to the electrical conductor, and a contact prong having a distal end, the contact prong extending through the contact slot into the plug channel, the distal end positioned in the plug channel and externally accessible within the plug channel, the distal end in the plug channel extending away from the contact base, and the contact prong being substantially orthogonal to the contact base, the contact base positioned on the front outer planar layer and the back outer planar layer;

wherein the contact prong is supported by the base wall such that a column strength of the contact prong is greater than a column strength of the electrical conductor.

2. The photovoltaic module of claim 1, wherein the contact prong has a prong stiffness about a contact axis, wherein the electrical conductor has a conductor stiffness about a conductor axis, and wherein the prong stiffness is greater than the conductor stiffness.

3. The photovoltaic module of claim 1, wherein the contact slot in the base wall is sized to support the contact against lateral bending.

4. The photovoltaic module of claim 1, wherein the contact prong is similarly sized to contact slot such that the base wall around the contact prong reinforces the column strength of the contact prong.

5. The photovoltaic module of claim 1, wherein the contact prong includes a contact cross-sectional area and the contact slot includes a similarly sized slot cross-sectional area that conforms to the contact cross-sectional area.

6. The photovoltaic module of claim 1, wherein the contact prong includes a contact cross-sectional area that is smaller than the slot cross-sectional area such that a gap is present between the base wall and the contact prong to support contact prong laterally when a mating connector is engaged with an external electrical connector.

7. The photovoltaic module of claim 1, wherein the plug receptacle is directly mounted on the front outer planar layer and the back outer planar layer of the module laminate via a clip fit.

8. The photovoltaic module of claim 1 further comprising:
an encapsulant surrounding the contact base between the front layer and the back layer; and
an adhesive between the plug receptacle and the module laminate.

9. The photovoltaic module of claim 1, wherein the contact prong is centered with the contact base and the contact base is directly mounted on the front outer planar layer and the back outer planar layer of the module laminate.

10. The photovoltaic module of claim 1, wherein the module laminate includes a lateral edge, and wherein the plug receptacle is mounted on the lateral edge.

11. The photovoltaic module of claim 10, wherein the plug receptacle includes a mount casing attached to the lateral edge, wherein the mount casing surrounds a contact channel on an opposite side of the base wall from the plug channel, and wherein the contact base is in the contact channel.

12. The photovoltaic module of claim 1, wherein the module laminate includes a first sub-string of photovoltaic cells including the photovoltaic cell, and a second sub-string of photovoltaic cells including a second photovoltaic cell, and further comprising a second plug receptacle mounted on the module laminate, and a second contact electrically connected to the second photovoltaic cell and extending through the second plug receptacle.

13. The photovoltaic module of claim 1 further comprising a module frame mounted along a lateral edge of the module laminate, wherein the module frame includes the plug receptacle and a second plug receptacle, and wherein the second contact extends through a second contact slot of the second plug receptacle.

14. The photovoltaic module of claim 1, wherein the plug receptacle is mounted on a back surface of the back layer, wherein the contact base is parallel to the back surface, and wherein the contact prong is orthogonal to the back surface.

15. A photovoltaic system, comprising:
a photovoltaic module including a module laminate including a photovoltaic cell electrically connected to an electrical conductor between a front layer and a back layer, a plug receptacle, the plug receptacle positioned within at least a portion of at least one of a perimeter of the front layer or a perimeter of the back layer and the plug receptacle mounted on the module laminate, wherein the plug receptacle includes a plug casing around a plug channel, and
a base wall having a contact slot aligned with the plug channel;
a contact including a contact base attached to the electrical conductor, and a contact prong having a distal end, the contact prong extending through the contact slot and into the plug channel, the distal end extending away from the module laminate, the distal end positioned in the plug channel, the distal end externally accessible within the plug channel, the contact prong being substantially orthogonal to the contact base, the contact base positioned on the front layer and the back layer, and wherein
the contact prong is supported by the base wall such that a column strength of the contact prong is greater than a column strength of the electrical conductor;
an off-panel electronics device; and
an external cable extending between and electrically connecting the contact and the off-panel electronics device.

16. The photovoltaic system of claim 15, wherein the off-panel electronics device includes one or more of a bypass diode, a microinverter, or a DC optimizer.

17. The photovoltaic system of claim 15, wherein the contact prong has a prong stiffness about a contact axis, wherein the electrical conductor has a conductor stiffness about a conductor axis, and wherein the prong stiffness is greater than the conductor stiffness.

18. The photovoltaic module of claim 15, wherein the contact prong is centered with the plug channel.

19. The photovoltaic module of claim 15, wherein the module laminate includes a lateral edge, and wherein the plug receptacle is mounted on the lateral edge.

20. The photovoltaic module of claim 19, wherein the plug receptacle includes a mount casing attached to the lateral edge, wherein the mount casing surrounds a contact channel on an opposite side of the base wall from the plug channel, and wherein the contact base is in the contact channel.

* * * * *